(12) United States Patent
Kato et al.

(10) Patent No.: US 9,030,020 B2
(45) Date of Patent: May 12, 2015

(54) SEMICONDUCTOR MEMORY DEVICE

(75) Inventors: Yoshiko Kato, Yokohama (JP);
Hidenobu Nagashima, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 935 days.

(21) Appl. No.: 13/053,671

(22) Filed: Mar. 22, 2011

(65) Prior Publication Data
US 2012/0119368 A1 May 17, 2012

(30) Foreign Application Priority Data

Nov. 11, 2010 (JP) ................................. 2010-252705

(51) Int. Cl.
*H01L 23/48* (2006.01)
*G11C 16/04* (2006.01)
*G11C 5/06* (2006.01)
*H01L 27/02* (2006.01)
*H01L 27/115* (2006.01)

(52) U.S. Cl.
CPC ............ *G11C 16/0483* (2013.01); *G11C 5/063* (2013.01); *H01L 27/0207* (2013.01); *H01L 27/11519* (2013.01); *H01L 27/11524* (2013.01); *H01L 2924/0002* (2013.01)

(58) Field of Classification Search
CPC combination set(s) only.
See application file for complete search history.

(56) References Cited

U.S. PATENT DOCUMENTS

| 7,701,742 | B2 | 4/2010 | Sakuma et al. | |
|---|---|---|---|---|
| 2008/0084728 | A1* | 4/2008 | Sakuma et al. | 365/63 |
| 2010/0177546 | A1* | 7/2010 | Sakuma et al. | 365/63 |

FOREIGN PATENT DOCUMENTS

| JP | 6-5811 | 1/1994 |
|---|---|---|
| JP | 2008-91893 | 4/2008 |

* cited by examiner

*Primary Examiner* — Hrayr A Sayadian
(74) *Attorney, Agent, or Firm* — Oblon, McClelland, Maier & Neustadt, L.L.P.

(57) ABSTRACT

In one embodiment, a semiconductor memory device includes a substrate, and device regions formed in the substrate to extend in a first direction which is parallel to a principal plane of the substrate. The device further includes select gates disposed on the substrate to extend in a second direction which is perpendicular to the first direction, and a contact region provided between the select gates on the substrate and including contact plugs disposed on the respective device regions. Further, the contact region includes partial regions, in each of which N contact plugs are disposed on N successive device regions to be arranged on a straight line being non-parallel to the first and second directions, where N is an integer of 2 or more. Further, the contact region includes the partial regions of at least two types whose values of N are different.

14 Claims, 7 Drawing Sheets

SEMICONDUCTOR MEMORY DEVICE

CROSS REFERENCE TO RELATED APPLICATION

This application is based upon and claims the benefit of priority from the prior Japanese Patent Application No. 2010-252705, filed on Nov. 11, 2010, the entire contents of which are incorporated herein by reference.

FIELD

Embodiments described herein relate to a semiconductor memory device.

BACKGROUND

Recently, semiconductor memory devices such as NAND flash memories have been included in various electronic devices. Due to requirements for providing such electronic devices with multiple functions, a semiconductor memory device has been required to have large memory capacity. Accordingly, memory cells of the semiconductor memory device have been required to be miniaturized.

A NAND flash memory will be described as an example. In a typical NAND flash memory, a plurality of memory cell transistors are electrically connected in series to form a NAND cell unit. One end of the NAND cell unit is electrically connected to a bit line via a select gate transistor, and the other end of the unit is electrically connected to a source line via another select gate transistor.

Recently, due to miniaturization of a memory cell array, densification and integration in a memory have been advanced. Accordingly, bit line contacts arranged between drain-side select gates have also been required to be reduced in size. However, it is difficult to simply reduce the size of the contacts and the space between the contacts, because they may cause the short of adjacent contacts, decrease in breakdown voltage between the contacts, increase in contact resistance due to the miniaturization, optical interference in lithography due to the shortened distance between the contacts, and the like.

Therefore, attempts to solve these problems have been recently made by using a staggered contact arrangement. An example of the staggered contact arrangement is a two-contact staggered arrangement in which two contacts are the repetition unit of a staggered structure. However, due to the advance of the miniaturization of the memory, the distance between adjacent contacts tends to be shorter, so that even the two-contact staggered arrangement cannot solve the above problems. Therefore, it can be considered to use a multiple-contact staggered arrangement in which three or more contacts are the repetition unit of the staggered structure. However, if the multiple-contact staggered arrangement is adopted, the distance between the select gates is increased due to this arrangement, resulting in the increase of the chip area.

Therefore, it is required to provide such a contact arrangement that can suppress the increase of the chip area while the short of the contacts and the decrease in breakdown voltage between the contacts are suppressed.

DETAILED DESCRIPTION

Embodiments will now be explained with reference to the accompanying drawings.

An embodiment described herein is a semiconductor memory device including a substrate, and device regions formed in the substrate to extend in a first direction which is parallel to a principal plane of the substrate. The device further includes select gates disposed on the substrate to extend in a second direction which is perpendicular to the first direction, and a contact region provided between the select gates on the substrate and including contact plugs disposed on the respective device regions. Further, the contact region includes partial regions, in each of which N contact plugs are disposed on N successive device regions to be arranged on a straight line being non-parallel to the first and second directions, where N is an integer of 2 or more. Further, the contact region includes the partial regions of at least two types whose values of N are different.

(First Embodiment)

Figure 1:
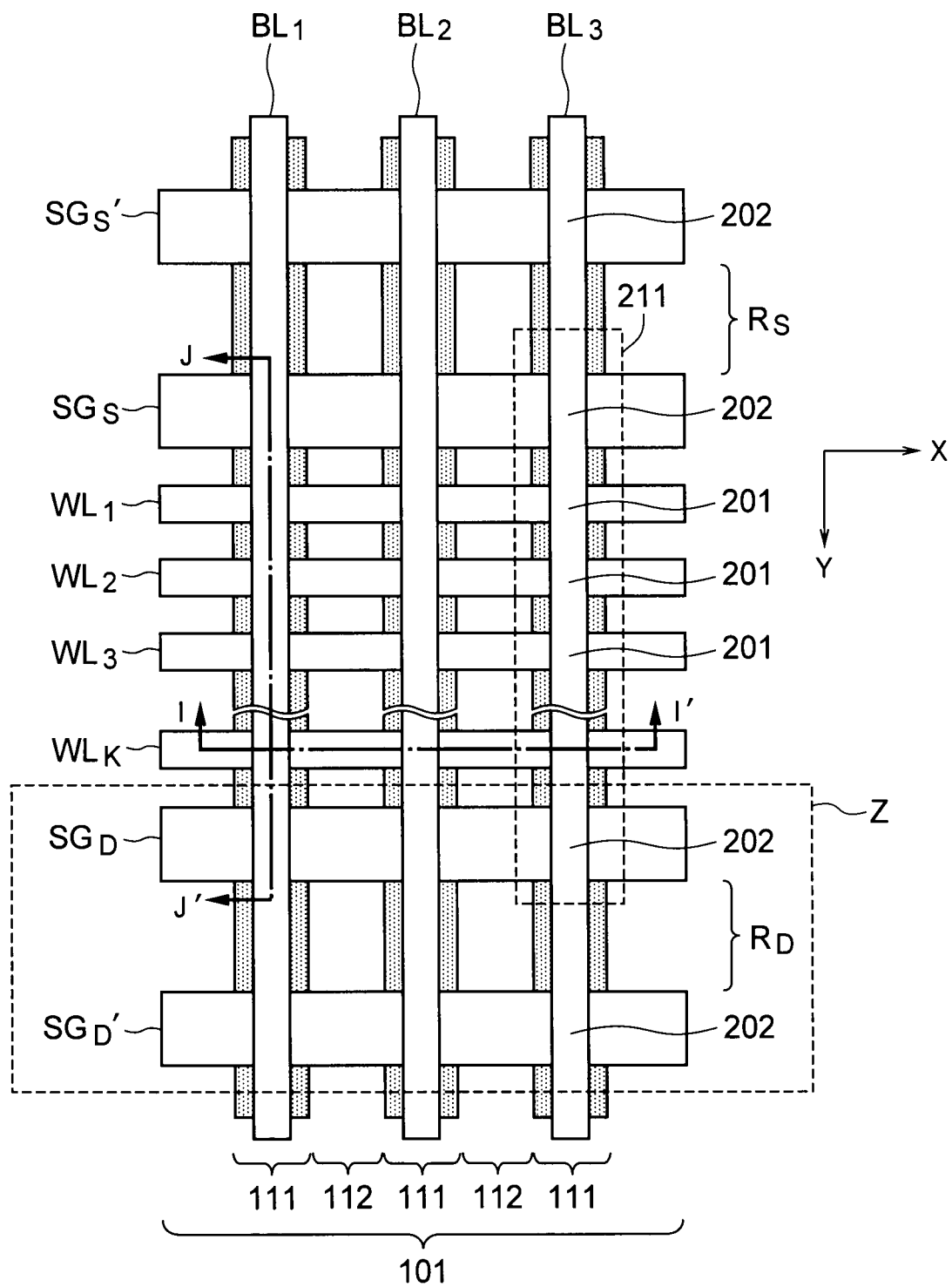
FIG. 1 is a plan view showing a structure of a semiconductor memory device of a first embodiment.

FIG. 1 is a plan view showing a structure of a semiconductor memory device of a first embodiment. The semiconductor memory device of FIG. 1 is a NAND flash memory.

FIG. 1 shows a memory cell array of the semiconductor memory device of the first embodiment. In the memory cell array of FIG. 1, memory cell transistors 201 and select gate transistors 202 are arranged in a two-dimensional array on a substrate 101. FIG. 1 shows X and Y directions which are parallel to the principal plane of the substrate 101 and are perpendicular to each other. The X direction corresponds to the channel width direction of those transistors, and the Y direction corresponds to the gate length direction of those transistors.

Further, FIG. 1 shows device regions 111 formed in the substrate 101. The device regions 111 are formed in the substrate 101 to extend in the Y direction and to be adjacent to each other in the X direction. The Y direction is an example of a first direction of the disclosure, and the X direction is an example of a second direction of the disclosure. The device regions 111 are also called active areas (AA). As shown in FIG. 1, the memory cell transistors 201 and the select gate transistors 202 are formed on the device regions 111.

Further, FIG. 1 shows isolation insulators 112 which are formed in the substrate 101 and isolate the device regions 111 from each other. In the first embodiment, the isolation insulators 112 are shallow trench isolation (STI) insulators.

In addition, as shown in FIG. 1, NAND strings 211 extending in the Y direction are formed on the individual device regions 111. Each of the NAND strings 211 has memory cell transistors 201 arranged in a line, and two select gate transistors 202 arranged so as to sandwich these memory cell transistors 201. In FIG. 1, the NAND strings 211 are arranged in the X direction to form the memory cell array.

Further, FIG. 1 shows word lines $WL_1$ to $WL_K$ extending in the X direction, and select gates $SG_S$ and $SG_D$ extending in the X direction, where K denotes an integer of 2 or more. The select gate $SG_S$ corresponds to a source-side select gate, and the select gate $SG_D$ corresponds to a drain-side select gate. These select gates $SG_S$ and $SG_D$ and the word lines $WL_1$ to $WL_K$ are commonly connected to gate electrodes of the select gate transistors 202 and the memory cell transistors 201 adjacent to each other in the X direction, respectively. Further, FIG. 1 shows select gates $SG_S'$ and $SG_D'$ extending in the X direction and adjacent to the select gates $SG_S$ and $SG_D$, respectively.

Further, FIG. 1 shows bit lines $BL_1$ to $BL_3$ extending in the Y direction. The bit lines $BL_1$ to $BL_3$ are arranged on the device region 111. As shown in FIG. 1, the memory cell transistors 201 are provided at intersections of the word lines $WL_1$ to $WL_K$ and the individual device regions 111. In addition, the select gate transistors 202 are provided at the intersections of the select gates $SG_S$ and $SG_D$ (and $SG_S'$ and $SG_D'$) and the individual device regions 111.

Further, FIG. 1 shows contact regions $R_S$ and $R_D$ provided on the substrate 101.

The contact region $R_S$ is provided between the source-side select gates $SG_S$ and $SG_S'$ on the substrate 101. The contact region $R_S$ includes contact plugs (not shown), which are formed on the individual device regions 111 between the source-side select gates $SG_S$ and $SG_S'$.

In addition, the contact region $R_D$ is provided between the drain-side select gates $SG_D$ and $SG_D'$. Similarly to the contact region $R_S$, the contact region $R_D$ includes contact plugs (not shown), which are formed on the individual device regions 111 between the drain-side select gates $SG_D$ and $SG_D'$.

Further, the detail of these contact plugs will be described later.

Figure 2:
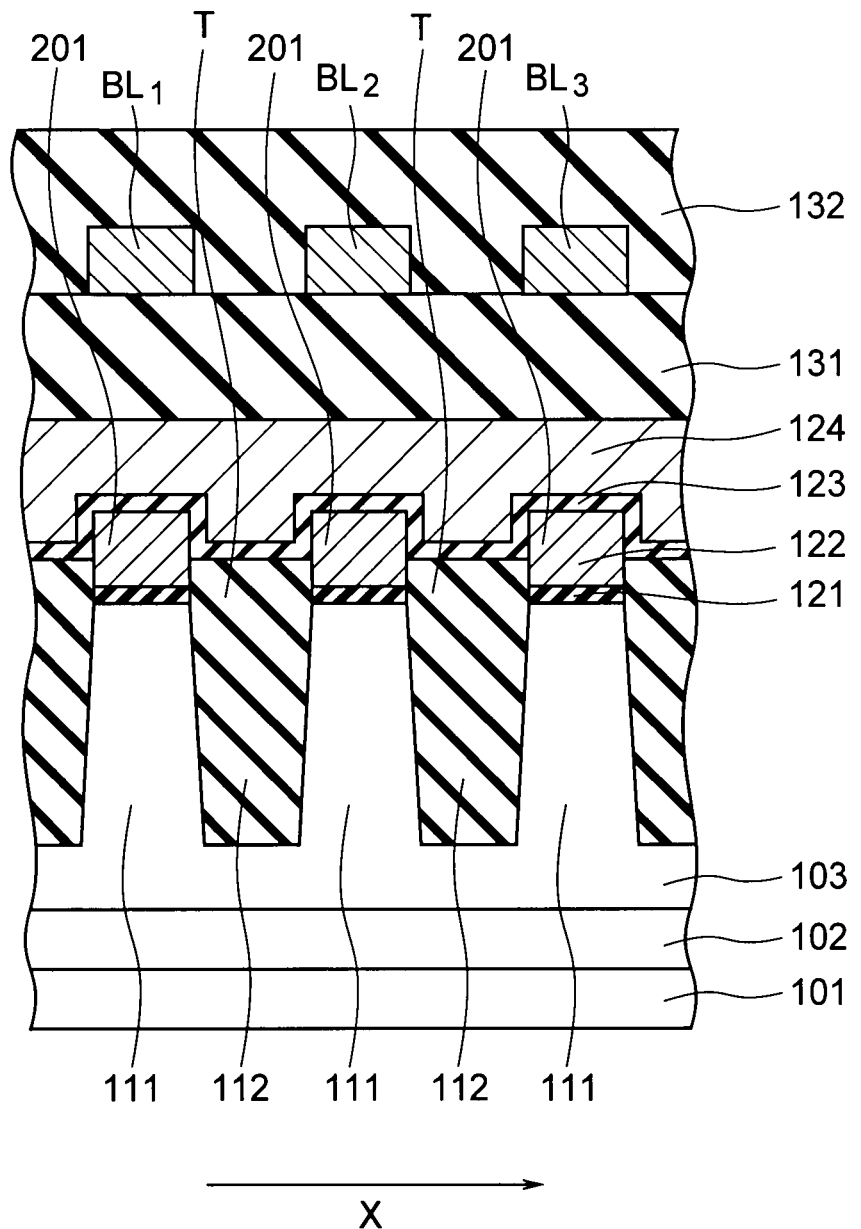
FIG. 2 is a side cross-sectional view taken along a line I-I' shown in FIG. 1.

FIG. 2 is a side cross-sectional view taken along a line I-I' shown in FIG. 1. FIG. 2 shows the AA (Active Area) cross section of the semiconductor memory device of the first embodiment.

Similarly to FIG. 1, FIG. 2 shows the substrate 101, the device regions 111, and the isolation insulators 112. Further, FIG. 2 shows a buried well region 102 and a well region 103 successively formed in the substrate 101.

In the first embodiment, the substrate 101 is a semiconductor substrate such as a silicon substrate. The buried well region 102 is an N-type well into which N-type impurities are implanted. For example, the N-type impurities are P (phosphorus). The well region 103 is a P-type well into which P-type impurities are implanted. For example, the P-type impurities are B (boron).

Further, FIG. 2 shows isolation trenches T formed in the well region 103. The device regions 111 are defined in the well region 103 by the isolation trenches T to extend in the Y direction. In addition, the isolation insulators 112 are buried into the isolation trenches T and isolate the device regions 111 from each other.

Further, similarly to FIG. 1, FIG. 2 shows the memory cell transistors 201 formed on the device regions 111.

Each of the memory cell transistors 201 includes a gate insulator 121, a floating gate 122, an inter-gate insulator 123, and a control gate 124. The floating gate 122 is formed on a device region 111 via the gate insulator 121. The control gate 124 is formed on the floating gate 122 via the inter-gate insulator 123.

In the first embodiment, while the gate insulator 121 and the floating gate 122 are divided for each memory cell transistor 201, the inter-gate insulator 123 and the control gate 124 are shared among the memory cell transistors 201 adjacent to each other in the X direction. The control gate 124 shown in FIG. 2 corresponds to the word line $WL_K$ shown in FIG. 1.

In addition, in the first embodiment, as shown in FIG. 2, the upper surfaces of the isolation insulators 112 are set lower than the upper surfaces of the floating gates 122. As a result, the lower surface of the inter-gate insulator 123 located on the isolation insulators 112 is lower than the lower surface of the inter-gate insulator 123 located on the floating gates 122. Similarly, the lower surface of the control gate 124 located on the isolation insulators 112 is lower than the lower surface of the control gate 124 located on the floating gates 122.

Further, FIG. 2 shows an inter layer dielectric 131 formed on the substrate 101 so as to cover the memory cell transistors 201. The bit lines $BL_1$ to $BL_3$ are formed on the inter layer dielectric 131. Further, FIG. 2 shows an inter layer dielectric 132 formed on the inter layer dielectric 131 so as to cover the bit lines $BL_1$ to $BL_3$.

Figure 3:
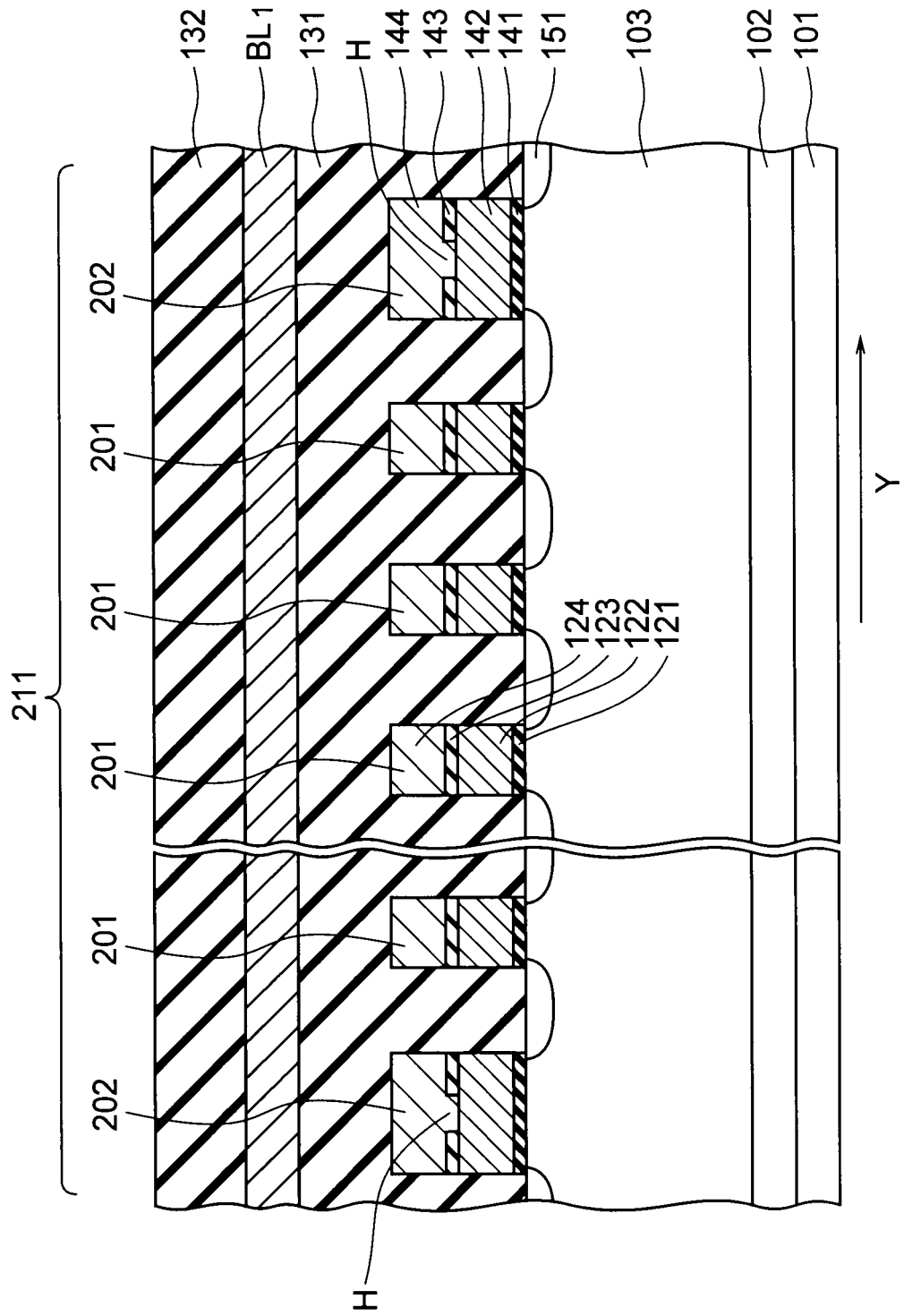
FIG. 3 is a side cross-sectional view taken along a line J-J' shown in FIG. 1.

FIG. 3 is a side cross-sectional view taken along a line J-J' shown in FIG. 1. FIG. 3 shows the GC (Gate Conductor) cross section of the semiconductor memory device of the first embodiment.

Similarly to FIG. 2, FIG. 3 shows the substrate 101, the buried well region 102, and the well region 103.

Further, FIG. 3 shows a plurality of memory cell transistors 201 and two select gate transistors 202 formed on the well region 103 (more specifically, on a device region 111).

Each of the select gate transistors 202 includes a first insulating layer 141, a first electrode layer 142, a second insulating layer 143, and a second electrode layer 144. The first electrode layer 142 is formed on the well region 103 via the first insulating layer 141. The second electrode layer 144 is formed on the first electrode layer 142 via the second insulating layer 143. The first electrode layer 142 and the second electrode layer 144 are electrically connected by an opening H provided in the second insulating layer 143.

FIG. 3 shows such memory cell transistors 201 and select gate transistors 202 that form a NAND string 211. These transistors are electrically connected in series by diffusion layers 151 formed in the well region 103. The control gates 124 shown in FIG. 3 are commonly connected among the memory cell transistors 201 adjacent to each other in the X direction so as to be the word lines $WL_1$ to $WL_K$ shown in FIG. 1. The second electrode layers 144 shown in FIG. 3 are commonly connected among the select gate transistors 202 adjacent to each other in the X direction so as to be the select gates $SG_S$ and $SG_D$ shown in FIG. 1.

Further, similarly to FIG. 2, FIG. 3 shows the inter layer dielectric 131 which covers these transistors, the bit line $BL_1$ formed on the inter layer dielectric 131, and the inter layer dielectric 132 which covers the bit line $BL_1$.

(1) Structure of Contact Region $R_D$ (Staggered Arrangement)

Hereinafter, the contact region $R_D$ shown in FIG. 1 will be described in detail.

Figure 4:
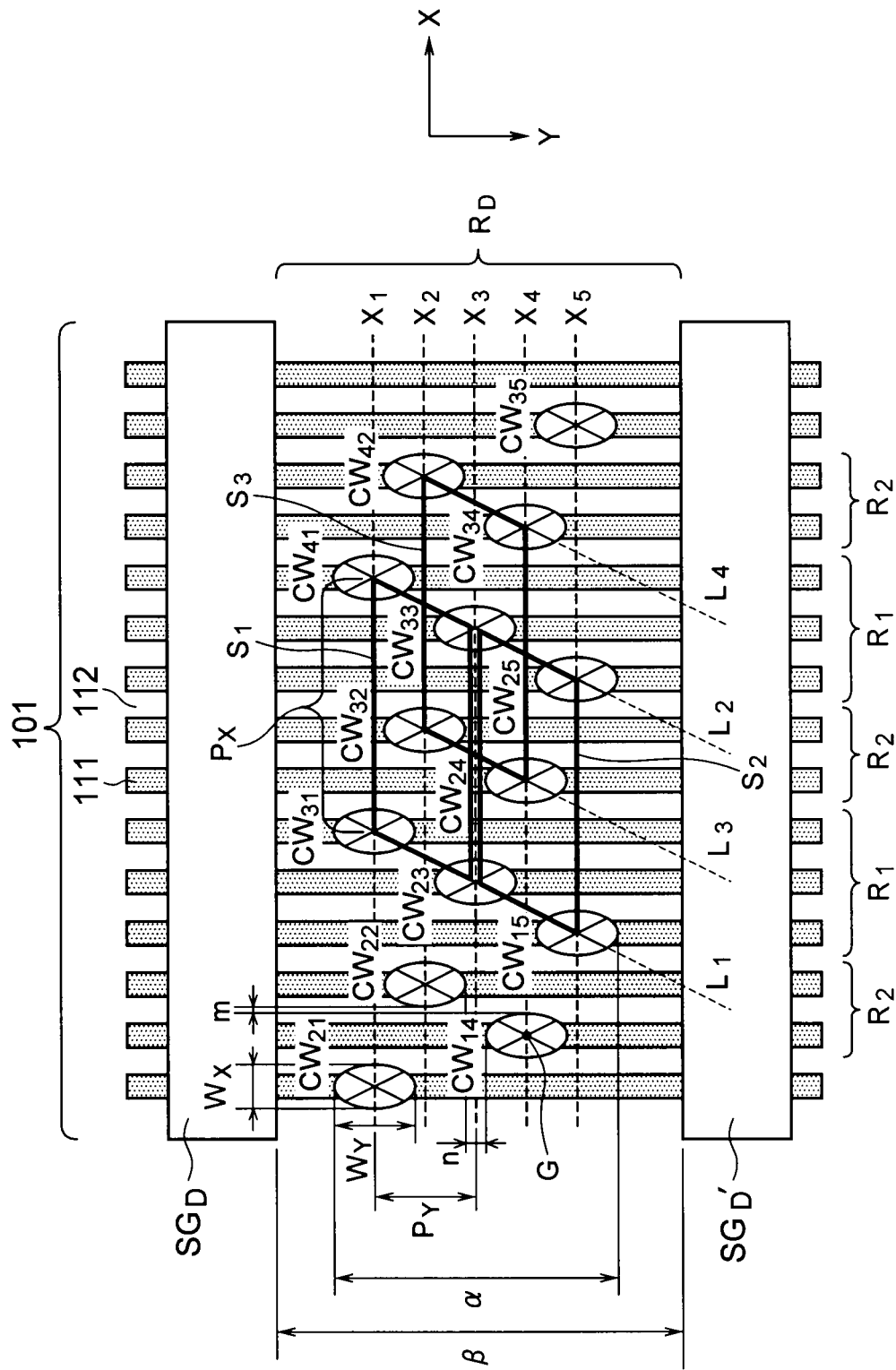
FIG. 4 is an enlarged plan view showing a region Z shown in FIG. 1.

FIG. 4 is an enlarged plan view showing a region Z shown in FIG. 1. FIG. 4 shows the contact region $R_D$ provided between the drain-side select gates $SG_D$ and $SG_D'$.

FIG. 4 shows contact plugs CW formed on the individual device regions 111. The subscripts added to the symbols CW are for distinguishing these contact plugs CW. These contact plugs CW are bit line contacts. The bottom surfaces of the contact plugs CW are contacted with the device regions 111, and the top surfaces of the contact plugs CW are contacted with the bit lines BL. In this way, in FIG. 4, one contact plug CW is arranged on one device region 111, and one contact plug CW is similarly arranged under one bit line BL.

The contact region $R_D$ of FIG. 4 includes first partial regions $R_1$ and second partial regions $R_2$.

In each first partial region $R_1$, three contact plugs CW are formed on three device regions 111 which are successively adjacent to each other in the X direction, so as to be arranged on a straight line which is non-parallel to the X and Y directions. For example, the contact plugs $CW_{31}$, $CW_{23}$, and $CW_{15}$ are formed on three successive device regions 111 so as to be arranged on a straight line $L_1$. In addition, the contact plugs $CW_{41}$, $CW_{33}$, and $CW_{25}$ are formed on three successive device regions 111 so as to be arranged on a straight line $L_2$. In this way, in each first partial region $R_1$, three contact plugs CW are disposed in a three-contact oblique arrangement.

In addition, in each second partial region $R_2$, two contact plugs CW are formed on two device regions 111 which are successively adjacent to each other in the X direction, so as to be arranged on a straight line which is non-parallel to the X and Y directions. For example, the contact plugs $CW_{32}$ and $CW_{24}$ are formed on two successive device regions 111 so as to be arranged on a straight line $L_3$. In addition, the contact plugs $CW_{42}$ and $CW_{34}$ are formed on two successive device regions 111 so as to be arranged on a straight line $L_4$. In this way, in each second partial region $R_2$, two contact plugs CW are disposed in a two-contact oblique arrangement. To improve the lithography margin, the straight lines $L_1$ to $L_4$ are desirably parallel to each other.

In the contact region $R_D$ of FIG. 4, the first partial regions $R_1$ and the second partial regions $R_2$ are alternately provided along the X direction. In this way, the contact region $R_D$ of FIG. 4 has a contact arrangement in which three-contact oblique arrangements and two-contact oblique arrangements are alternately repeated.

Consequently, the contact region $R_D$ of FIG. 4 has a contact arrangement in which irregular five-contact staggered arrangements are periodically repeated. Therefore, the contact arrangement shown in FIG. 4 will be referred to as an irregular five-contact (three-contact+two-contact) staggered arrangement.

Further, in the first embodiment, $N_1$ contact plugs CW may be obliquely arranged in each first partial region $R_1$, where $N_1$ denotes a constant integer of 2 or more, and $N_2$ contact plugs CW may be obliquely arranged in each second partial region $R_2$, where $N_2$ denotes a constant integer of 2 or more and is different from $N_1$. In this case, the difference between $N_1$ and $N_2$ may be +1 or −1, so that an irregular $(N_1+N_2)$-contact staggered arrangement can be realized. However, the difference between $N_1$ and $N_2$ may be a value other than ±1.

(2) Description of Symbols and Parameters in FIG. 4

Next, symbols and parameters shown in FIG. 4 will be described.

In FIG. 4, the width (diameter) of each contact plug CW in the Y direction is indicated by $W_Y$, and the pitch between the contact plugs CW in the Y direction is indicated by $P_Y$. More specifically, $P_Y$ represents the pitch in the Y direction between the contact plugs CW arranged in the same partial region. In the first embodiment, the contact plugs CW in each partial region is arranged so that the pitch $P_Y$ is a constant value, and is longer than the width $W_Y$ ($P_Y > W_Y$). Further, the first partial regions $R_1$ and the second partial regions $R_2$ have the same pitch $P_Y$ and the same width $W_Y$, so that the lithography margin can be improved. In the first embodiment, the partial regions in the contact region $R_D$ have the same pitch $P_Y$ and the same width $W_Y$.

Further, in FIG. 4, the distance between the contact plugs CW in the Y direction is indicated by the symbol n. More specifically, n represents the distance in the Y direction between the contact plugs CW arranged in the same partial region and adjacent to each other in the X direction. The relation of $P_Y = W_Y + n$ is established between the width $W_Y$, the pitch $P_Y$, and the distance n. In the first embodiment, the distance n is set to be the value in which electric breakdown voltage between the contact plugs CW can be sufficiently secured. In addition, in FIG. 4, the distance in the X direction between the contact plugs CW arranged in the same partial region and adjacent to each other in the X direction is indicated by a symbol m. In the contact region $R_D$ of FIG. 4, the shortest distance between the contact plugs CW which are adjacent to each other in the X direction is represented by $(n^2+m^2)^{1/2}$.

FIG. 4 also shows a center point (center axis) G of each contact plug CW. The center axis G is located at the position passing through the intersection of the long axis (axis in the Y direction) and the short axis (axis in the X direction) of each contact plug CW.

FIG. 4 also shows straight lines $X_1$ to $X_5$ extending in the X direction. As shown in FIG. 4, the center points G of the contact plugs CW in the first partial regions $R_1$ are located on the straight lines $X_1$, $X_3$, and $X_5$, and the center points G of the contact plugs CW in the second partial regions $R_2$ are located on the straight lines $X_2$ and $X_4$. In this way, each of the straight lines $X_1$ to $X_5$ (further, the straight lines $L_1$ to $L_4$) passes through the center points G of contact plugs CW. Hereinafter, the contact plugs CW arranged on the straight lines $X_1$ to $X_5$ will be called the first-stage to the fifth-stage contact plugs CW. Desirably, the intervals in the Y direction between the straight lines $X_1$ to $X_5$ are all equal to each other. This is because the lithography margin is improved by arranging the contact plugs CW regularly.

In addition, in the contact region $R_D$ of FIG. 4, three-contact oblique arrangements and two-contact oblique arrangements are alternately repeated, thereby realizing a structure in which five contact plugs CW are obliquely arranged on five device regions 111 at one device region interval, so as to be arranged on the straight lines $X_1$ to $X_5$ in this order, respectively. For example, the contact plugs $CW_{21}$, $CW_{22}$, $CW_{23}$, $CW_{24}$, and $CW_{25}$ are obliquely arranged on five device regions 111 at one device region interval. In addition, the contact plugs $CW_{31}$, $CW_{32}$, $CW_{33}$, $CW_{34}$, and $CW_{35}$ are obliquely arranged on five device regions 111 at one device region interval.

Further, in the first embodiment, the straight line $X_2$ passes between the first-stage contact plugs CW and the third-stage contact plugs CW in the first partial regions $R_1$, and the second-stage contact plugs CW in the second partial regions $R_2$ are arranged on this straight line $X_2$. Similarly, the straight line $X_4$ passes between the third-stage contact plugs CW and the fifth-stage contact plugs CW in the first partial regions $R_1$, and the fourth-stage contact plugs CW in the second partial regions $R_2$ are arranged on this straight line $X_4$.

On the other hand, the straight line $X_3$ passes between the second-stage contact plugs CW and the fourth-stage contact plugs CW in the second partial regions $R_2$, and the third-stage contact plugs CW in the first partial regions $R_1$ are arranged on this straight line $X_3$.

In this way, in the first embodiment, the M-th-stage contact plugs CW are arranged on a straight line which is parallel to the X direction and passes between the (M−1)-th-stage contact plugs CW and the (M+1)-th-stage contact plugs CW, where M denotes an integer of 2 to 4. As described above, such arrangement can be realized by making the pitch $P_Y$ longer than the width $W_Y$. In addition, the even-stage contact plugs CW are arranged between the odd-stage contact plugs CW, so that the interval between the contact plugs CW which are adjacent in the X direction can be increased.

Further, in FIG. 4, the width (diameter) of each contact plug CW in the X direction is indicated by $W_X$, and the pitch between the contact plugs CW in the X direction is indicated by $P_X$. More specifically, $P_X$ represents the pitch in the X direction between the contact plugs CW which are arranged on the same straight line extending in the X direction and are adjacent to each other in the X direction. In other words, $P_X$ represents the pitch between the contact plugs CW in the X direction when a first partial region $R_1$ and a second partial region $R_2$ are integrated. In the first embodiment, the pitch $P_X$ has a length equal to the total width of five device regions 111 and five isolation insulators 112. In other words, four device regions 111 are sandwiched between the contact plugs CW which are arranged on the same straight line extending in the X direction and are adjacent to each other in the X direction.

Further, in the irregular $(N_1+N_2)$-contact staggered arrangement, the pitch $P_X$ has a length equal to the total width of $(N_1+N_2)$ device regions 111 and $(N_1+N_2)$ isolation insulators 112. In other words, $(N_1+N_2-1)$ device regions 111 are sandwiched between the contact plugs CW which are arranged on the same straight line extending in the X direction and are adjacent to each other in the X direction.

In FIG. 4, the distance in the Y direction between the upper ends of the first-stage contact plugs CW and the lower ends of the fifth-stage contact plugs CW is indicated by α. Also, the distance in the Y direction between the select gates $SG_D$ and $SG_D'$ is indicated by β. The relation of α<β is established between the distances α and β. In addition, the relation of α=3$W_Y$+2n is established between the distance α, the width $W_Y$, and the distance n.

(3) Comparison with First and Second Comparative Examples

Next, the semiconductor memory device of the first embodiment will be compared with semiconductor memory devices of first and second comparative examples.

Figure 5:
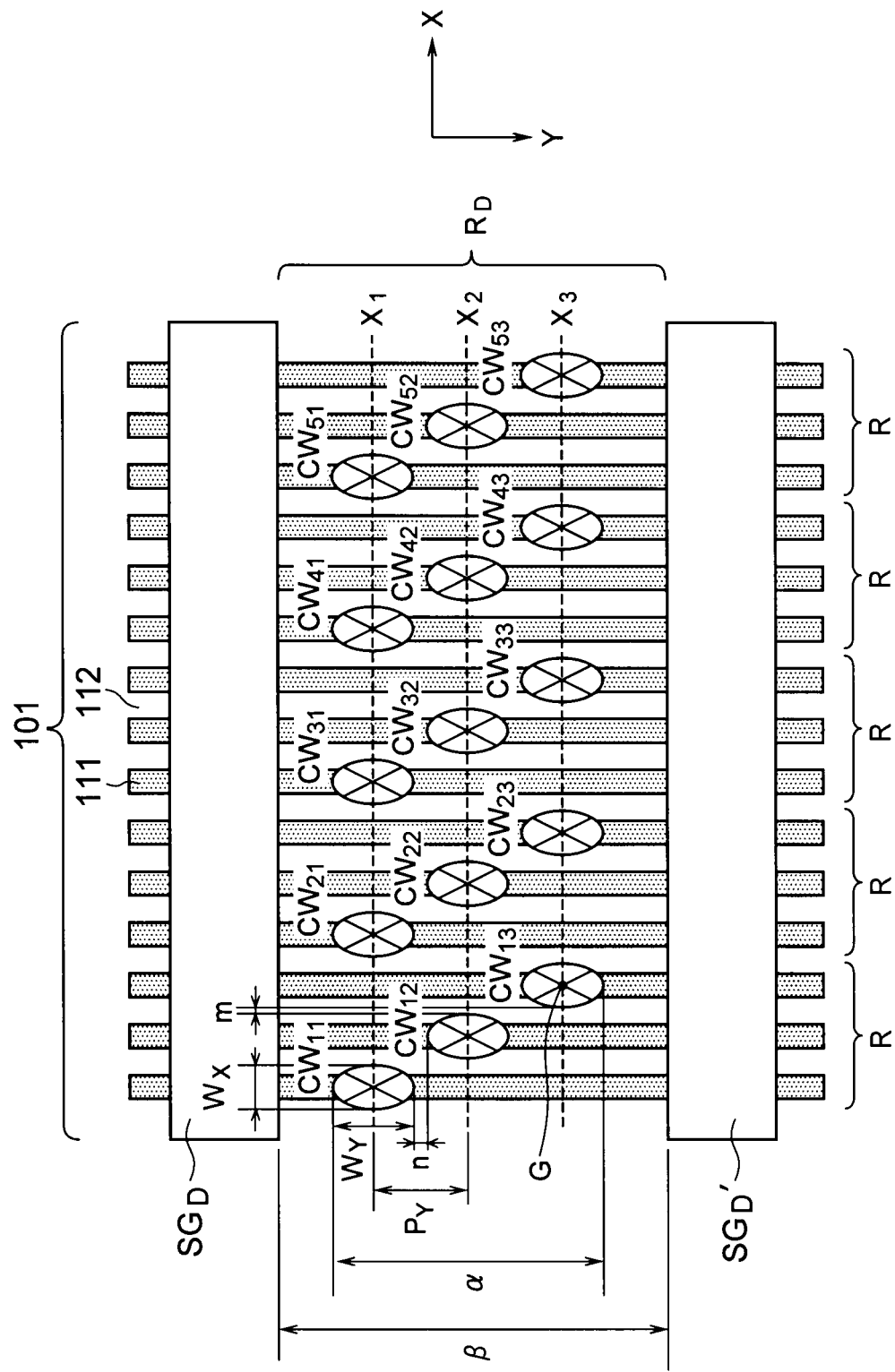
FIG. 5 is a plan view showing a structure of a semiconductor memory device of a first comparative example.

FIG. 5 is a plan view showing the structure of the semiconductor memory device of the first comparative example.

The contact region $R_D$ of FIG. 5 has a contact arrangement in which three-contact oblique arrangements are periodically repeated in the X direction (called simple three-contact staggered arrangement).

In the contact arrangement of the first comparative example, the density of the contact plugs CW is greatly different between an end portion such as the first-stage or the third-stage and a center portion such as the second-stage. Due to the presence of such density difference, variations in lithography and processing are easily caused at the time of forming the contact plugs CW.

Figure 6:
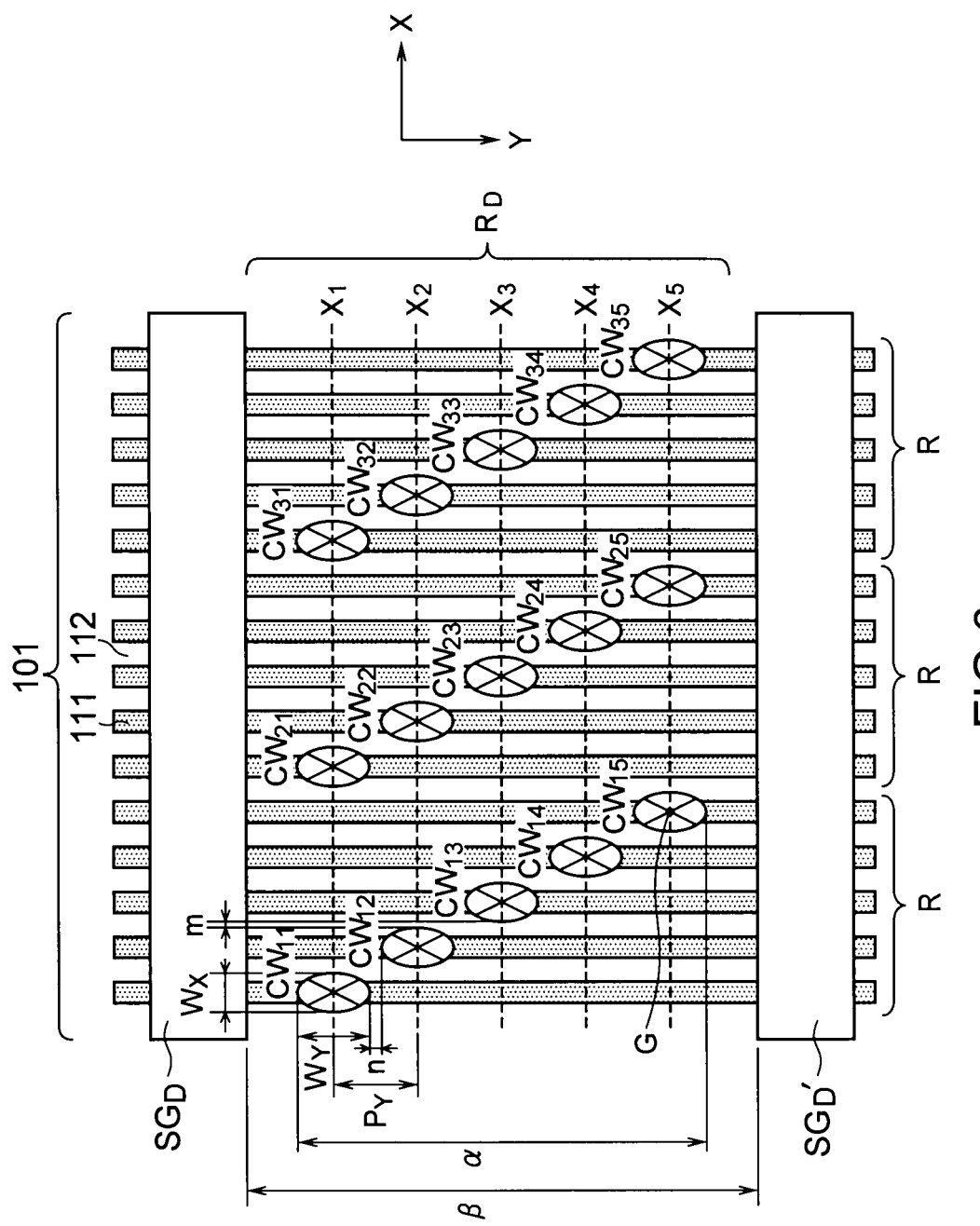
FIG. 6 is a plan view showing a structure of a semiconductor memory device of a second comparative example.

FIG. 6 is a plan view showing the structure of the semiconductor memory device of the second comparative example.

The contact region $R_D$ of FIG. 6 has a contact arrangement in which five-contact oblique arrangements are periodically repeated in the X direction (called simple five-contact staggered arrangement).

The contact arrangement of the second comparative example has the distance β between the select gates longer than that in the first comparative example.

On the contrary, in the first embodiment, the contact arrangement shown in FIG. 4 (irregular five-contact staggered arrangement) is adopted.

In the first embodiment, five contact plugs CW forming one oblique arrangement are not arranged on five successive device regions 111, but arranged on five contact plugs CW at one device region interval. In addition, the distance n of the first embodiment can be set to the same value as the distance n of the first comparative example, so that electric breakdown voltage between the contact plugs CW cannot be lowered.

This is because in both of the first embodiment and the first comparative example, the shortest distance between the contact plugs CW which are adjacent to each other in the X direction is $(n^2+m^2)^{1/2}$. Consequently, in the first embodiment, the distance α can be set to a distance shorter than that of the second comparative example (simple five-contact staggered arrangement), and equal to that of the first comparative example (simple three-contact staggered arrangement) (see FIG. 4). In other words, in the first embodiment, the relation of α=3$W_Y$+2n is established among the distance α, the width $W_Y$, and the distance n. Therefore, according to the first embodiment, the distance n and the pitch $P_Y$ can be sufficiently secured without increasing the distance β between the select gates.

According to the first embodiment, the distance n and the pitch $P_Y$ are sufficiently secured, so that the short of the contact plugs CW and the decrease in electric breakdown voltage between the contact plugs CW can be suppressed. Further, according to the first embodiment, the distance β between the select gates is shortened, so that the increase of the chip area can be suppressed.

Also, in the first embodiment, the contact arrangement in which the three-contact oblique arrangements and the two-contact oblique arrangements are alternately repeated is adopted. Consequently, in the first embodiment, a close structure is realized in which a contact plug CW in a second partial region $R_2$ is arranged in each lattice cell of a lattice, which is formed by 1) a straight line passing the contact plugs CW that are arranged in a first partial region $R_1$ and are arranged on the same straight line, 2) a straight line passing the contact plugs CW that are arranged in its neighboring first partial region $R_1$ and are arranged on the same straight line, and 3) and straight lines passing the contact plugs CW that are arranged in these first partial regions $R_1$ and are adjacent to each other in the X direction. In addition, a close structure is realized in which a contact plug CW in a first partial region $R_1$ is arranged in each lattice cell of a lattice, which is formed by 1) a straight line passing the contact plugs CW that are arranged in a second partial region $R_2$ and are arranged on the same straight line, 2) a straight line passing the contact plugs CW that are arranged in its neighboring second partial region $R_2$ and are arranged on the same straight line, and 3) and straight lines passing the contact plugs CW that are arranged in these second partial regions $R_2$ and are adjacent to each other in the X direction. For example, in FIG. 4, the contact plug $CW_{32}$ is arranged in a lattice cell $S_1$, and the contact plug $CW_{24}$ is arranged in a lattice cell $S_2$. Such close structures have an advantage that the density difference between the contact plugs CW near the select gates SG (end portion) and the contact plugs CW near the center between the select gates SG (center portion) can be reduced.

Therefore, according to the first embodiment, variations in lithography and processing can be reduced at the time of forming the contact plugs CW, so that the lithography accuracy and the processing accuracy can be improved.

As described above, in each partial region of the first embodiment, N contact plugs CW are arranged on N successive device regions 111 so as to be arranged on the straight line being non-parallel to the X and Y directions, where N denotes an integer of 2 or more. Further, the contact region $R_D$ of the first embodiment includes the partial regions of two types whose values of N are different. More specifically, the value of N is set to $N_1$ or $N_2$ for each partial region, so that the irregular $(N_1+N_2)$-contact staggered arrangement can be realized. However, in the first embodiment, contact arrangements other than such irregular $(N_1+N_2)$-contact staggered arrangement may be adopted. Also, the contact region $R_D$ of the first embodiment may include the partial regions of three or more types whose values of N are different.

(4) Structure of Contact Region $R_D$ (Lattice Arrangement)

Hereinafter, referring to FIG. 4, the structure of the contact region $R_D$ will be described in more detail.

$S_1$ and $S_2$ shown in FIG. 4 represent lattice cells of a lattice that is formed by the straight lines $L_1$ and $L_2$ extending in the same direction which are non-parallel to the X and Y directions, and by the straight lines $X_1$, $X_3$, and $X_5$ extending in the X direction. The contact plugs CW in the first partial regions $R_1$ are arranged at the respective lattice points of the lattice. For example, the contact plugs $CW_{31}$, $CW_{23}$, $CW_{33}$, and $CW_{41}$ are arranged at the respective lattice points forming the lattice cell $S_1$, and the contact plugs $CW_{23}$, $CW_{15}$, $CW_{25}$, and $CW_{33}$ are arranged at the respective lattice points forming the lattice cell $S_2$.

In this way, in the first embodiment, the contact plugs CW in the first partial regions $R_1$ are arranged at the respective lattice points of the lattice that is formed by first straight lines extending in the same direction which are non-parallel to the X and Y directions, and by second straight lines extending in the X direction. Here, the first straight lines include the straight lines $L_1$ and $L_2$ and other straight lines which are parallel to the straight lines $L_1$ and $L_2$. Also, the second straight lines include the straight lines $X_1$, $X_3$, and $X_5$. In the first embodiment, with such contact arrangement, regular arrangements of the contact plugs CW in the first partial regions $R_1$ can be realized. Specifically, the contact plugs CW in the first partial regions $R_1$ are arranged so as to form a plane rhombic lattice (parallelogram lattice).

Hereinafter, the direction in which the straight lines $L_1$ and $L_2$ extend will be referred to as a third direction with respect to the Y direction (the first direction) and the X direction (the second direction).

In addition, in FIG. 4, a contact plug CW in a second partial region $R_2$ is arranged in each lattice cell of the above lattice. For example, the contact plug $CW_{32}$ is arranged in the lattice cell $S_1$, and the contact plug $CW_{24}$ is arranged in the lattice cell $S_2$.

In this way, in the first embodiment, a contact plug CW in a second partial region $R_2$ is arranged in each lattice cell of the lattice which is formed by the first and second straight lines. Consequently, in the first embodiment, regular arrangements of the contact plugs CW in the second partial regions $R_2$ can also be realized. Specifically, the contact plugs CW in the second partial regions $R_2$ are arranged so as to form a face-centered rhombic lattice together with the contact plugs CW in the first partial regions $R_1$. Further, two or more contact plugs CW in a second partial region $R_2$ may be arranged in each lattice cell of the lattice.

In addition, $S_3$ shown in FIG. 4 represents lattice cell of a lattice that is formed by the straight lines $L_3$ and $L_4$ extending in the third direction and by the straight lines $X_2$ and $X_4$ extending in the X direction. The contact plugs CW in the second partial regions $R_2$ are arranged at the respective lattice points of this lattice. For example, the contact plugs $CW_{32}$, $CW_{24}$, $CW_{34}$, and $CW_{42}$ are arranged at the respective lattice points forming the lattice cell $S_3$.

In this way, in the first embodiment, the contact plugs CW in the second partial regions $R_2$ are arranged at the respective lattice points of the lattice that is formed by third straight lines which extend in the third direction and pass between the first straight lines, and by fourth straight lines which extend in the X direction and pass between the second straight lines. Here, the third straight lines include the straight lines $L_3$ and $L_4$, and other straight lines which are parallel to the straight lines $L_3$ and $L_4$. Also, the fourth straight lines include the straight lines $X_2$ and $X_4$. In the first embodiment, with such contact arrangement, regular arrangements of the contact plugs CW in the second partial regions $R_2$ can be realized. Specifically, the contact plugs CW in the second partial regions $R_2$ are arranged so as to form a plane rhombic lattice.

Further, in the first embodiment, the first and the third straight lines both extend in the third direction and are parallel to each other. However, these straight lines may not be parallel to each other. For example, the first straight lines may extend in the third direction, and the third straight lines may extend in the fourth direction which is non-parallel to the first to the third directions.

Finally, effects of the first embodiment will be described.

As described above, in each partial region of the first embodiment, N contact plugs CW are arranged on N successive device regions 111 so as to be arranged on the straight line being non-parallel to the X and Y directions. Further, the contact region $R_D$ of the first embodiment includes the partial regions of at least two types whose values of N are different. More specifically, the value of N is set to be $N_1$ or $N_2$ for each partial region, so that the irregular $(N_1+N_2)$-contact staggered arrangement can be realized.

According to the first embodiment, the irregular $(N_1+N_2)$-contact staggered arrangement is adopted, so that the distance α can be shorter than in the case where the simple $(N_1+N_2)$-contact staggered arrangement is adopted (for example, see FIGS. 4 and 6). The distance β between the select gates largely depends on the distance α. Therefore, according to the first embodiment, while the distance β between the select gates is shortened, the distances n and m and the pitch $P_Y$ can be sufficiently secured.

By sufficiently securing the distances n and m and the pitch $P_Y$, the short of the contact plugs CW and the decrease in breakdown voltage between the contact plugs CW can be suppressed. In addition, by decreasing the distance β between the select gates, the increase of the chip area can be suppressed.

Therefore, according to the first embodiment, while the short of the contact plugs CW and the decrease in breakdown voltage between the contact plugs CW can be suppressed, the increase of the chip area can be suppressed.

In addition, according to the first embodiment, variations in lithography and processing can be reduced at the time of forming the contact plugs CW, so that the lithography accuracy and the processing accuracy can be improved.

Hereinafter, a second embodiment which is a modification of the first embodiment will be described focusing on differences between the first and second embodiments.

(Second Embodiment)

Figure 7:
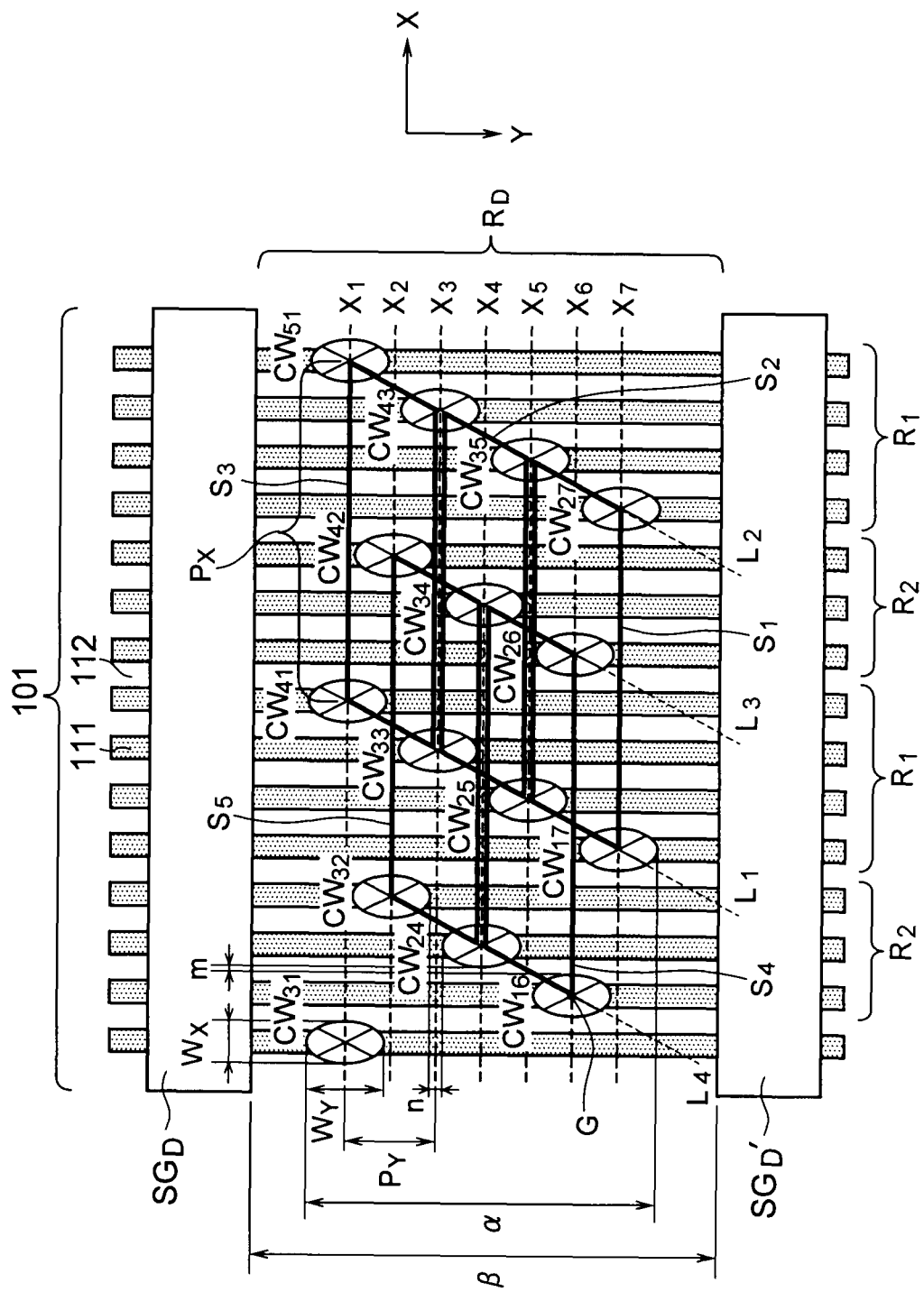
FIG. 7 is a plan view showing a structure of a semiconductor memory device of a second embodiment.

FIG. 7 is a plan view showing a structure of a semiconductor memory device of a second embodiment.

In each first partial region $R_1$ of FIG. 4, three contact plugs CW are arranged in the oblique arrangement. Also, in each second partial region $R_2$, two contact plugs CW are arranged in the oblique arrangement.

On the contrary, in each first partial region $R_1$ of FIG. 7, four contact plugs CW are arranged in an oblique arrangement. Also, in each second partial region $R_2$, three contact plugs CW are arranged in an oblique arrangement. Consequently, in FIG. 7, a contact arrangement in which four-contact oblique arrangements and three-contact oblique arrangements are alternately repeated (called irregular seven-contact staggered arrangement) can be realized. In FIG. 7, the pitch $P_X$ has a length equal to the total width of seven device regions 111 and seven isolation insulators 112.

In the second embodiment, seven contact plugs CW in a seven-contact staggered arrangement are not arranged on seven successive device regions 111, but arranged on seven device regions 111 at two device region interval. Consequently, in the second embodiment, the distance α can be set to be a distance shorter than that of the simple seven-contact staggered arrangement, and equal to that of the simple four-contact staggered arrangement. Therefore, according to the second embodiment, similarly to the first embodiment, while the distance β between the select gates is shortened, the distance n and the pitch $P_Y$ can be sufficiently secured.

According to the second embodiment, the distance n and the pitch $P_Y$ can be sufficiently secured, so that the short of the contact plugs CW and the decrease in breakdown voltage between the contact plugs CW can be suppressed. In addition, according to the second embodiment, the distance β between the select gates can be shortened, so that the increase of the chip area can be suppressed.

FIG. 7 shows lattice cells $S_1$, $S_2$, and $S_3$ of a lattice that is formed by the straight lines $L_1$ and $L_2$ extending in the third direction and by the straight lines $X_1$, $X_3$, $X_5$, and $X_7$ extending in the X direction. Similarly to the first embodiment, the contact plugs CW in the first partial regions $R_1$ are arranged at the respective lattice points of this lattice. Consequently, the regular arrangement of the contact plugs CW in the first partial regions $R_1$ can be realized.

Further, FIG. 7 shows lattice cells $S_4$ and $S_5$ of a lattice that is formed by the straight lines $L_3$ and $L_4$ extending in the third direction, and by the straight lines $X_2$, $X_4$, and $X_6$ extending in the X direction. Similarly to the first embodiment, the contact plugs CW in the second partial regions $R_2$ are arranged at the respective lattice points of this lattice. Consequently, similarly to the contact plugs CW in the first partial region $R_1$, the regular arrangement of the contact plugs CW in the second partial regions $R_2$ can be realized.

Finally, effects of the second embodiment will be described.

As described above, in each partial region of the second embodiment, the irregular $(N_1+N_2)$-contact staggered arrangement (here $N_1+N_2=7$) is adopted, so that the distance a can be shorter than in a case where the simple $(N_1+N_2)$-contact plug staggered arrangement is adopted. Therefore, according to the second embodiment, while the distance β between the select gates is shortened, the distances n and m and the pitch $P_Y$ can be sufficiently secured.

By sufficiently securing the distances n and m and the pitch $P_Y$, the short of the contact plugs CW and the decrease in breakdown voltage between the contact plugs CW can be suppressed. In addition, by decreasing the distance β between the select gates, the increase of the chip area can be suppressed.

Therefore, according to the second embodiment, while the short of the contact plugs CW and the decrease in breakdown voltage between the contact plugs CW can be suppressed, the increase of the chip area can be suppressed.

In addition, according to the embodiment, variations in lithography and processing can be reduced at the time of forming the contact plugs CW, so that the lithography accuracy and the processing accuracy can be improved. In particular, when the value of $N_1+N_2$ is increased, the density difference between the contact plug CW near the select gates SG (end portion) and the contact plug CW near the center between the select gates SG (center portion) tends to be increased. For this reason, as the value of $N_1+N_2$ is increased, the effect of improving the lithography accuracy and the processing accuracy becomes greater.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   a substrate;
   device regions provided in the substrate to extend in a first direction which is parallel to a principal plane of the substrate;
   select gates disposed on the substrate to extend in a second direction which is perpendicular to the first direction; and
   a contact region provided between the select gates on the substrate and including contact plugs disposed on the respective device regions,
   wherein the contact region includes:
   first partial regions, in each of which three contact plugs are disposed on three successive device regions so that the three contact plugs are arranged on a straight line which is non-parallel to the first and second directions; and
   second partial regions, in each of which two contact plugs are disposed on two successive device regions so that the two contact plugs are arranged on a straight line which is non-parallel to the first and second directions,
   wherein the first and second partial regions are alternately disposed in the contact region along the second direction.

2. The device of claim 1, wherein
   the contact plugs are disposed so that four device regions are sandwiched between the contact plugs adjacent in the second direction.

3. The device of claim 1, wherein
   the contact plugs in each of the first and second partial regions are disposed so that a pitch between the contact plugs in the first direction is larger than a width of each contact plug in the first direction.

4. The device of claim 1, wherein
   the contact plugs in each of the first and second partial regions are disposed so that a pitch between the contact plugs in the first direction is a constant value.

5. The device of claim 4, wherein
   the pitch in the first direction is the same value among the first and second partial regions in the contact region.

6. The device of claim 1, wherein
   the straight lines of the first and second partial regions are parallel to each other.

7. The device of claim 1, wherein
   each contact plug in the second partial regions is arranged on a straight line which is parallel to the second direction and passes between the contact plugs in the first partial regions.

8. The device of claim 1, wherein the contact plugs in each first partial region are arranged at respective lattice points of a lattice which is formed by:
   first straight lines extending in a third direction which is non-parallel to the first and second directions; and
   second straight lines extending in the second direction.

9. The device of claim 8, wherein the contact plugs in each second partial region are arranged at respective lattice points of a lattice which is formed by:
   third straight lines extending in the third direction and passing between the first straight lines; and fourth straight lines extending in the second direction and passing between the second straight lines.

10. The device of claim 9, wherein
one or more contact plugs in the second regions are disposed in each lattice cell of the lattice formed by the first and second straight lines.

11. The device of claim 9, wherein
a total number of the second and fourth straight lines of the contact region is five.

12. The device of claim 8, wherein the contact plugs in each second partial region are arranged at respective lattice points of a lattice which is formed by:
third straight lines extending in a fourth direction which is non-parallel to the first to third directions and passing between the first straight lines; and
fourth straight lines extending in the second direction and passing between the second straight lines.

13. The device of claim 12, wherein
one or more contact plugs in the second regions are disposed in each lattice cell of the lattice formed by the first and second straight lines.

14. The device of claim 12, wherein
a total number of the second and fourth straight lines of the contact region is five.

* * * * *